United States Patent
Minihold et al.

(10) Patent No.: US 7,123,023 B2
(45) Date of Patent: Oct. 17, 2006

(54) METHOD AND DEVICE FOR MEASURING INTERMODULATION DISTORTION

(75) Inventors: Roland Minihold, Munich (DE); Thilo Bednorz, Erding (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 10/512,955

(22) PCT Filed: Mar. 28, 2003

(86) PCT No.: PCT/EP03/03286
§ 371 (c)(1),
(2), (4) Date: Mar. 24, 2005

(87) PCT Pub. No.: WO03/093841
PCT Pub. Date: Nov. 13, 2003

(65) Prior Publication Data
US 2005/0159908 A1    Jul. 21, 2005

(30) Foreign Application Priority Data
Apr. 30, 2002  (DE) ................. 102 19 340

(51) Int. Cl.
*G01R 23/20* (2006.01)
(52) U.S. Cl. .................. 324/624; 324/612
(58) Field of Classification Search .......... 324/612, 324/624
See application file for complete search history.

(56) References Cited

U.S. PATENT DOCUMENTS

| | | | |
|---|---|---|---|
| 3,711,769 A | 1/1973 | Peake | 324/57 N |
| 4,774,454 A | 9/1988 | Yamaguchi et al. | 324/57 DE |
| 6,263,289 B1 | 7/2001 | Hassun et al. | 702/69 |
| 6,320,461 B1 | 11/2001 | Lee | 330/52 |
| 6,567,762 B1 * | 5/2003 | Bourde et al. | 702/107 |

FOREIGN PATENT DOCUMENTS

EP    499 346 A1    8/1992

OTHER PUBLICATIONS

"Ultra-Linear Power Amplifier Characterization Using Dynamic Range Extension Techniques", Hassun et al., IEEE MTT-S Digest, 2001, pp. 1683-1686.
International Search Report in PCT/EP03/03286 dated Jul. 10, 2003.
International Preliminary Examination Report in PCT/EP03/03286 dated Jul. 16, 2004.

* cited by examiner

Primary Examiner—Walter Benson

(57) ABSTRACT

A measuring device is provided for measuring intermodulation distortion of a measuring object. The measuring device includes a first signal generator which produces a first signal that is supplied to an input of a measuring object, a signal combining device having a first input which is connected to the output of the measuring object, and a signal analyzing device which is connected to the output of the signal combining device. According to the disclosure, a second signal generator which is synchronized with the first signal generator is provided, and second signal generator producing a second signal that is supplied to a second input of the signal combining device.

20 Claims, 1 Drawing Sheet

METHOD AND DEVICE FOR MEASURING INTERMODULATION DISTORTION

This is the U.S. national phase of International Application No. PCT/EP03/03286 filed Mar. 28, 2003, the entire disclosure of which is incorporated herein by reference.

BACKGROUND OF THE DISCLOSURE

1. Field of the Disclosure

The disclosure relates to a method and a device for measuring intermodulation distortions.

2. Related Technology

Intermodulation distortions (d3-intermodulation), especially in the form of adjacent-channel power (ACPR) represent an important specification especially for power amplifiers, which are used in mobile telephone base stations. This also applies in particular to power amplifiers, which are driven with several carrier signals. Nonlinearities in the power amplifier lead to crosstalk from one channel into the adjacent channels, causing an interference effect. To measure the intermodulation distortions of a power amplifier, the amplifier is therefore supplied with a measuring signal in the useful channel, and the power components in the adjacent channels are measured.

A method and a device for measuring intermodulation distortions in a device under test, such as a power amplifier, are already known from U.S. Pat. No. 6,263,289. With the method according to U.S. Pat. No. 6,263,289, a signal generator is connected to the input of the device under test (DUT). The device under test may, for example, be a power amplifier, which is terminated with a terminal resistance. A directional coupler is provided at each input and output of the device under test. The signal of the coupler at the output of the device under test is supplied directly to a signal combiner (power combiner), while the signal picked up via the coupler at the input of the device under test is supplied to the signal combiner through a network for modifying the level and the phase. The network for modifying the level and phase subjects the signal picked up at the input of the device under test to the same level and phase changes experienced by the signal in the device under test, but this signal pathway is subjected to an additional phase displacement of 180° relative to the signal pathway leading through the device under test. When measuring the adjacent-channel power (ACPR), adjacent-channel power components which are already contained in the input signal of the device under test are therefore compensated.

The method known from U.S. Pat. No. 6,263,289 has the disadvantage that a delay compensation is possible only within the range of a few 100 ns, because a larger delay compensation cannot be achieved by the network for modifying level and phase. Devices under test with longer delays cannot therefore be measured using the known methods. It is also disadvantageous that a network for modifying the level and phase, which operates with sufficient accuracy, is structured in a relatively expensive manner, as shown in FIG. 6 of U.S. Pat. No. 6,263,289. The known method is therefore associated with a relatively high realization costs.

SUMMARY OF THE DISCLOSURE

The disclosure provides a method and a measuring device for measuring intermodulation distortions in a device under test, which allows measurements to be made with increased accuracy but reduced costs.

A method is provided for measuring intermodulation distortions of a device under test by supplying, indirectly or directly, an initial high-frequency signal, which is generated by a first signal, generator, to an input of a device under test. Further supplying, indirectly or directly, an output signal from an output of the device under test via a signal combiner to a signal analyzer and supplying, indirectly or directly, a second high-frequency signal, which is generated by a second signal generator and synchronized with the first signal generator, via the signal combiner to the signal analyzer.

Similarly, a measuring device for measuring intermodulation distortions of a device under test is provided which includes first signal generator and generates a first high-frequency signal, which is supplied indirectly or directly to an input of the device under test. Further including a signal combiner, of which the first input is indirectly or directly connected to the output of the device under test, a signal analyzer, which is indirectly or directly connected to the output of the signal combiner and a second signal generator synchronized with the first signal generator, that generates a second high-frequency signal, which is supplied indirectly or directly to a second input of the signal combiner.

DETAILED DESCRIPTION

Figure 1:
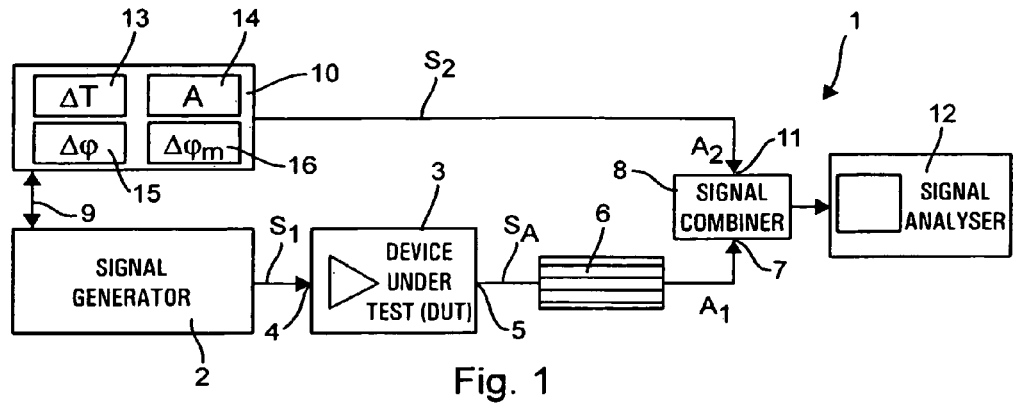
FIG. 1 shows a block circuit diagram of a first exemplary embodiment of a measuring device.

The disclosure is based on the knowledge that a considerably greater measuring accuracy can be achieved at a reduced cost by using separate signal generators for the measured signal and the reference signal. With the solution according to the disclosure, a first signal generator generates an input signal supplied to a device under test, while a second signal generator synchronized with the first signal generator generates a reference signal, which is supplied to a signal combiner. The group delay in the device under test and also the phase displacement in the device under test can be compensated within a relatively large framework by presenting a corresponding time delay and/or phase displacement of the reference signal generated by the second signal generator relative to the measured signal generated by the first signal generator. Delays through the device under test in the microsecond range, which currently arise in power amplifiers with digital feed-forward linearization, can also be compensated using the measuring method according to the disclosure. With the level-phase matching network defined in the prior art, this is possible only with great difficulty or not at all. Moreover, delay compensation within the band width of the measured signal can take place in a frequency-independent manner, that is to say, over a broad band. With the method according to the disclosure, a suppression of undesirable signal components in the measured signal of more than '26 dB is achieved.

At lest one of the signal generators can be adjusted with reference to the time delay, amplitude and phase position both of the high-frequency signal and also of the modulation signal, with which the high-frequency signal is modulated. The phase of the high-frequency signal and also the modulation signal are both adjusted with a 180° phase difference relative to the output signal of the device under test, so that the maximum elimination of the signal occurs. With the level-phase matching networks known from the prior art, phase compensation of the modulation signal separately from the high-frequency signal is never possible, and this therefore represents a further major advantage of the method according to the disclosure.

Adjustment of the phase position of the high-frequency signal and the modulation signal should be possible with a very small step width preferably less than 1/50 of the period, by further preference less than 1/100 of the period, so that the 180°-phase compensation can be adjusted extremely accurately. The output signal of the device under test can be linked either via a damping element, of which a damping factor is dimensioned in such a manner that the signal level at the output of the damping element approximately corresponds to the signal level at the input of the device under test, or via a coupler disposed at the output of the device under test, wherein, in this case, a coupling factor should be dimensioned in such a manner that the signal level at the output of the coupler approximately corresponds with the signal level at the input of the device under test.

The exemplary embodiment of the measuring device 1 according to the disclosure shown in FIG. 1 includes a first signal generator 2, which generates a first high-frequency signal $S_1$, which is supplied to the input 4 of a device under test 3 or DUT. In the exemplary embodiment, the output 5 with the output signal $S_A$ from the device under test 3 is connected via a damping element 6 to a first input 7 of a signal combiner 8. A second signal generator 10 synchronized with the first signal generator 2 via a synchronization line 9 is connected to a second input 11 of the signal combiner 8. The signal combiner 8 combines the input signals at the inputs 7 and 11 to form a combined signal, which is supplied to a signal analyzer 12. The signal analyzer may, for example, be a spectrum analyzer or another appropriate measuring device.

The high-frequency signal $S_1$ generated by the first signal generator 2 and the high-frequency signal $S_2$ generated by the second signal generator 10 are modulated in the signal generators 2 and 10 with an appropriate modulation signal, so that, for example, a WCDMA (Wide Band Code Division Multiple Access) signal according to a standard of the third generation of mobile telephones (such as the 3 GPP standard) is generated as a test signal. The device under test 3 can be any 2-port device. Power amplifiers are measured by preference. Such power amplifiers are designed to be relatively broadband, so that a high amplification is provided in the useful channel with the minimum possible crosstalk in the adjacent channels. Intermodulation distortions in the form of adjacent-channel power ACPR (Adjacent Channel Power Ratio) must be kept to the minimum. The intermodulation distortions, especially in the form of adjacent-channel power ACPR are measured by the measuring device according to the invention as a specification of the power amplifier to be measured.

Figure 2:
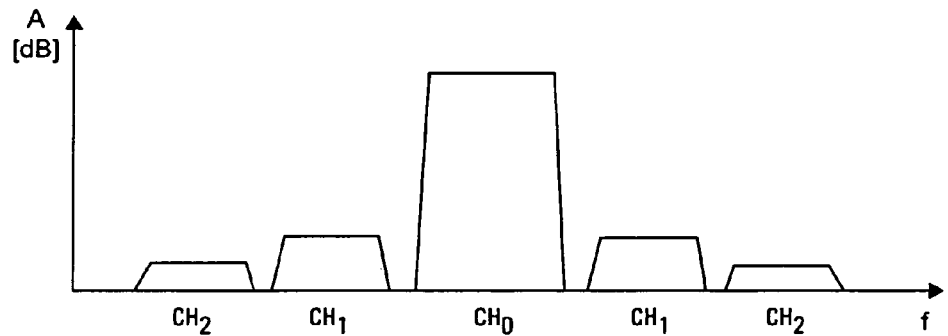
FIG. 2 shows a spectrum at the output of the device under test.

By way of explanation, FIG. 2 shows the typical output spectrum of a power amplifier which is to be measured. The diagram shows the level A of the output signal $S_A$ of the power amplifier as a function f driven only in the useful channel $CH_0$. It is evident that, because of non linearities, the power amplifier also generates considerably weakened spectra in the directly adjacent channels $CH_{-1}$ and $CH_1$ and in the more remote adjacent channels $CH_{-2}$ and $CH_2$. To measure the adjacent channel power ACPR in the adjacent channels $CH_{-2}$, $CH_{-1}$, $CH_1$, $CH_2$ with a high level of accuracy, the power amplifier, and/or, in general, the device under test 3 should only be driven in the useful channel $CH_0$. However, a real signal generator 2 also generates slight adjacent-channel power components in the adjacent channels, which are already supplied to the inputs 4 of the power amplifier serving as the device under test 3, and are also amplified by this device because of the broad-band design. This falsifies the measurement of the adjacent-channel power ACPR. It is therefore necessary to compensate the adjacent-channel power components generated by the signal generator 2.

For this purpose, the disclosure proposes the use of the second signal generator 10, which is preferably of identical structure to the first signal generator 2 and synchronized with the first signal generator 2. Accordingly, the same adjacent-channel power components occur in the high-frequency signal $S_2$ generated by the second signal generator 10 as in the high-frequency signal $S_1$ generated by the first signal generator 2, the damping element 6 is dimensioned in such a manner that its damping factor approximately matches the amplification factor of the power amplifier serving as the device under test 3, so that approximately equal signal levels are provided at the inputs 7 and 11 of the signal combiner 8.

The first signal generator 2 and/or the second signal generator 10 comprise devices for adjusting the time delay, the amplitude and the phase position of the signal generated by the signal generator 2 and 10 respectively. In the exemplary embodiment illustrated, a device 13 is provided in the second signal generator 10, for adjusting the time delay ΔT, with which the high-frequency signal $S_2$ from the second signal generator 10 is emitted, and an adjustment device 14 is provided for adjusting the amplitude A, with which a high-frequency signal $S_2$ from the second signal generator 10 is emitted. Furthermore, the phase position Δϕ, with which the high-frequency signal $S_2$ is emitted, can be adjusted with an adjustment, device 15. The high-frequency signal is preferably modulated with a modulation signal, for example, in a I/Q modulator. The phase position $\Delta\phi_m$ of the modulation signal is preferably adjustable by means of a further adjustment device 16.

The amplitude A, with which the second high-frequency signal $S_2$ is emitted, is adjusted in such a manner that the amplitudes $A_1$ and $A_2$, with which the high-frequency signals $S_1$ and $S_2$ of the signal generators 2 and 10 arrive at the signal combiner 8, agree as accurately as possible. The time delay ΔT, with which the second high-frequency signal $S_2$ is emitted, is adjusted in such a manner that the high-frequency signal $S_2$ form the second signal generator 10 is delayed relative to the high-frequency signal $S_1$ from the first signal generator 2 by a time offset, which corresponds as accurately as possible to the group delay of the high-frequency signal $S_1$ through the device under test 3. Furthermore, the phase position Δϕ, with which a high-frequency signal $S_2$ is emitted, is adjusted in such a manner that the high-frequency signal $S_2$ from the second signal generator 10 is displaced relative to the high-frequency signal $S_1$ form the first signal generator 2 by one phase, which approximately corresponds to the phase displacement through the device under test 3 with the addition of a phase angle of 180°. As a result, the two signals at the inputs 7 and 11 of the signal combiner 8 are coherent but inverted relative to one another, that is to say, the signals arrive at the signal combiner 8 simultaneously with the same amplitude but with a phase offset of 180°. The signal components of the input signal $S_1$ of the device under test 3 are therefore almost completely suppressed in the output signal $S_A$ form the device under test 3.

If power components are present in the adjacent channels $CH_{-2}$, $CH_{-1}$, $CH_1$, $CH_2$, these are also present in the reference signal $S_2$ and are suppressed because of the 180° phase position and are therefore not registered by the signal analyzer 12.

With a WCDMA signal, a broad-band, modulated multiple carrier signal is used. According to one further development of the disclosure, the phase position of the modulation signal can therefore also be adjusted in such a manner that a 180°-phase difference is also produced at the signal combiner 8 for the modulation signal. For this purpose, the modulation signal, with which a high-frequency signal $S_2$ from the second signal generator 10 is modulated, is adjusted in such a manner that the modulation signal of the second signal generator 10 is displaced relative to the modulation signal of the first signal generator 2 by one phase, which corresponds as accurately as possible to the modulation phase displacement, that is to say, the phase displacement of the modulation signal through the device under test 3 with the addition of 180°.

In this context, it is advantageous if the phase position of the high-frequency signal and of the modulation signal can also both be adjusted with the smallest possible step width. Preferably, the phase positions $\Delta\phi$ and $\Delta\phi_m$ can be adjusted with a step width of less than 1/50, by further preference less than 1/100 of the period of a high-frequency signal and/or of the modulation signal. Accordingly, with a sufficiently small step width, a broadband signal suppression of more than 26 dB can be achieved. As a result, an increase in measurement dynamics can be achieved with reference to the analyzer 12, which must be driven with a lower signal level.

Figure 3:
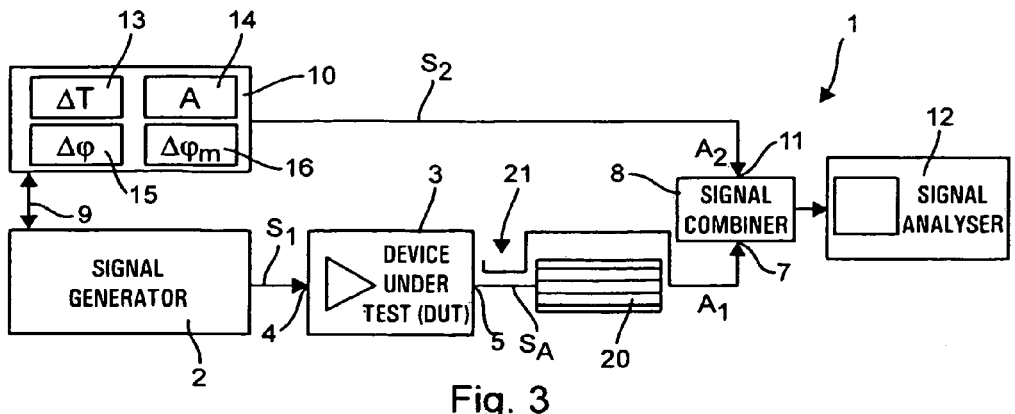
FIG. 3 shows a second exemplary embodiment of the measuring device.

FIG. 3 shows a second exemplary embodiment of the measuring device 1. Elements which have already been described in the context of FIG. 1 are labeled with identical reference numbers to avoid repetition of the description.

By way of distinction from the exemplary embodiment illustrated in FIG. 1, the output 5 of the device under test 3 in the exemplary embodiment shown in FIG. 3 is not connected via a damping element 6 to the first input 7 of the signal combiner 8, but the output 5 of the device under test 3 is terminated with a terminal resistance 20, and at the output 5 of the device under test 3, a directional coupler 21 is provided, which decouples the output signal with a given coupling factor. While in the case of the exemplary embodiment shown in FIG. 1, the damping factor of the damping element 6 should have approximately the same magnitude as the amplification factor of the device under test 3; with the exemplary embodiment shown in FIG. 3, the coupling factor of the coupler 21 should have approximately the same magnitude as the amplification factor of the device under test 3, so that the signal amplitudes $A_1$ and $A_2$ present at the inputs 7 and 11 are of approximately the same order of magnitude, and only a fine adjustment needs to be made with the adjustment device 14 for balancing the amplitude A.

Other embodiments are possible, for example, measurements of n-port devices, with n−1 input ports are conceivable, wherein a different input signal is supplied to each input port. In this context, for every input port, in addition to the signal generator for, the measured signal, a signal generator should be povided for the reference signal, and all reference signals of the reference signal generators should be supplied to the signal combiner 8, which should, in this case, also be designated as an n-port device.

The invention claimed is:

1. A method for measuring intermodulation distortions of a device under test comprising the steps of:

supplying, indirectly or directly, an initial high-frequency signal, which is generated by a first signal generator, to an input of the device under test;

supplying, indirectly or directly, an output signal from an output of the device under test via a signal combiner to a signal analyzer; and supplying, indirectly or directly, a second high-frequency signal, which is generated by a second signal generator and synchronized with the first signal generator, via the signal combiner to the signal analyzer, when the second high-frequency signal is generated in such a manner that the second high-frequency signal is inversely coherent to the first high-frequency signal.

2. The method according to claim 1, comprising adjusting a phase position, with which the high frequency signal is emitted from the first and/or second signal generator, at the first signal generator and/or at the second signal generator, in such a manner that the high-frequency signal from the second signal generator is displaced relative to the high-frequency signal emitted from the first signal generator by a phase, which approximately corresponds to the phase displacement through the device under test with the addition of 180°.

3. The method according to claim 1, comprising modulating the high-frequency signal of the first and second signal generator with a modulation signal and, at the first signal generator and/or at the second signal generator, adjusting a phase position, with which the high-frequency signal is modulated with the modulation signal from the first and/or the second signal generator, in such a manner that the modulation signal from the second signal generator is displaced relative to the modulation signal from the first signal generator by a phase, which approximately corresponds to the modulation phase displacement through the device under test with the addition of 180°.

4. The method according to claim 1, comprising adjusting amplitudes, of the high-frequency signals emitted from the first and/or the second signal generator, at the fist signal generator and/or at the second signal generator, in such a manner that the amplitudes, with which the high-frequency signals from the signal generators arrive at the signal combiner, are approximately equal.

5. A method for measuring intermodulation distortions of a device under test comprising the steps of:

supplying, indirectly or directly, an initial high-frequency signal, which is generated by a first signal generator, to an input of the device under test;

supplying, indirectly or directly, an output signal from an output of the device under test via a signal combiner to a signal analyzer;

supplying, indirectly or directly, a second high-frequency signal, which is generated by a second signal generator and synchronized with the first signal generator, via the signal combiner to the signal analyzer; and, adjusting a time delay, with which the high-frequency signal is emitted from the first and/or second signal generator, at the first signal generator and/or at the second signal generator in such a manner that the high-frequency signal from the second signal generator is delayed by a time offset relative to the high-frequency signal emitted from the first signal generator, which approximately corresponds to the group delay through the device under test.

6. A method for measuring intermodulation distortions of a device under test comprising the steps of:

supplying, indirectly or directly, an initial high-frequency signal, which is generated by a first signal generator, to an input of the device under test;

supplying, indirectly or directly, an output signal from an output of the device under test via a signal combiner to a signal analyzer:

supplying, indirectly or directly, a second high-frequency signal, which is generated by a second signal generator and synchronized with the first signal generator, via the signal combiner to the signal analyzer; and, disposing a damping element between the device under test and the signal combiner, and that a damping factor of the damping element is dimensioned in such a manner that a signal level at the output of the damping element approximately agrees with a signal level at the input of the device under test, and wherein the device under test is an amplifier.

7. A method for measuring intermodulation distortions of a device under test comprising the steps of:

supplying, indirectly or directly, an initial high-frequency signal, which is generated by a first signal generator, to an input of the device under test;

supplying, indirectly or directly, an output signal from an output of the device under test via a signal combiner to a signal analyzer;

supplying, indirectly or directly, a second high-frequency signal, which is generated by a second signal generator and synchronized with the first signal generator, via the signal combiner to the signal analyzer; and disposing a coupler between the device under test and a terminal resistance, and dimensioning a coupling factor in such a manner that the signal level at the output of the coupler approximately agrees with the signal level at the input of the device under test, and wherein the device under test is an amplifier, the output of which is terminated with the terminal resistance.

8. A measuring device for measuring intermodulation distortions of a device under test comprising:

a first signal generator, which generates a first high-frequency signal, which is supplied indirectly or directly to an input of the device under test;

a signal combiner, of which the first input is indirectly or directly connected to the output of the device under test;

a signal analyzer, which is indirectly or directly connected to the output of the signal combiner; and a second signal generator synchronized with the first signal generator, which generates a second high-frequency signal, which is supplied indirectly or directly to a second input of the signal combiner;

wherein the second signal generator generates the second high-frequency signal in a manner inversely coherent to the first high-frequency signal.

9. The measuring device according to claim 8, wherein in the first signal generator and/or in the second signal generator, a phase position, with which the high-frequency signal is emitted from the first and/or the second signal generator respectively, can be adjusted, and wherein the phase position is adjusted in such a manner that the high-frequency signal from the second signal generator is displaced relative to the high-frequency signal emitted from the first signal generator by a phase, which approximately corresponds to the phase displacement through the device under test with the addition of 180°.

10. The measuring device according to claim 9, wherein the step width, with which the phase position of the high-frequency signal from the first signal generator and/or the second signal generator can be adjusted, is less than $1/50$ of the period of the high-frequency signal.

11. The measuring device according to claim 10, wherein said phase position is less than $1/100$ of the period of the high-frequency signal.

12. The measuring device according to claim 8, wherein the high frequency signal from the first and second signal generator is modulated with a modulation signal, and in the first signal generator and/or in the second signal generator, a phase position, with which the high-frequency signal is modulated with the modulation signal from the first and/or second signal generator, can be adjusted, and wherein the phase position is adjusted in such a manner that the modulation signal of the second signal generator is displaced relative to the modulation signal of the first signal generator by a phase, which approximately corresponds to the modulation phase displacement through the device under test with the addition of 180°.

13. The measuring device according to claim 12, wherein the step width, with which the phase position of the modulation signal from the first signal generator and/or from the second signal generator can be adjusted, is less than $1/50$ of the period of the modulation signal.

14. The measuring device according to claim 13, wherein said phase position is less than $1/100$ of the period of the modulation signal.

15. The measuring device according to claim 8, wherein in the first signal generator and/or the second signal generator, an amplitude, with which the high-frequency signal is emitted from the first and/or second signal generator, can be adjusted, wherein the amplitude is adjusted in such a manner that the amplitudes, with which the high-frequency signals from the signal generators arrive at the signal combiner, are approximately equal.

16. A measuring device for measuring intermodulation distortions of a device under test comprising:

a first signal generator, which generates a first high-frecquency signal, which is supplied indirectly or directly to an input of the device under test;

a signal combiner, of which the first input is indirectly or directly connected to the output of the device under test;

a signal analyzer, which is indirectly or directly connected to the output of the signal combiner; and a second signal generator synchronized with the first signal generator, which generates a second high-frequency signal, which is supplied indirectly or directly to a second input of the signal combiner, wherein in the first signal generator and/or in the second signal generator, a time delay, with which the high-frequency signal is emitted from the first and/or the second signal generator respectively, can be adjusted, and wherein the time delay is adjusted in such a manner, that the high-frequency signal from the second signal generator is delayed relative to the high-frequency signal emitted from the first signal generator by a time offset, which approximately corresponds to the group delay through the device under test.

17. A measuring device for measuring intermodulation distortions of a device under test comprising:

a first signal generator, which generates a first high-frequency signal, which is supplied indirectly or directly to an input of the device under test;

a signal combiner, of which the first input is indirectly or directly connected to the output of the device under test;

a signal analyzer, which is indirectly or directly connected to the output of the signal combiner; and a second signal generator synchronized with the first signal generator, which generates a second high-frequency signal, which is supplied indirectly or directly to a second input of the signal combiner, wherein the device under test is an amplifier, that a damping element is disposed between the device under test and the signal combiner, and that a damping factor of the damping element is dimensioned in such a manner that a signal level at the output of the damping element approximately agrees with a signal level at the input of the device under test.

18. A measuring device for measuring intermodulation distortions of a device under test comprising:

a first signal generator, which generates a first high-frequency signal, which is supplied indirectly or directly to an input of the device under test;

a signal combiner, of which the first input is indirectly or directly connected to the output of the device under test;

a signal analyzer, which is indirectly or directly connected to the output of the signal combiner and a second signal generator synchronized with the first signal generator, which generates a second high-frequency signal, which is supplied indirectly or directly to a second input of the signal combiner, wherein the device under test is an amplifier, of which the output is terminated with a terminal resistance, and that between the device under test and the terminal resistance, a coupler is arranged, of which a coupling factor is dimensioned in such a manner that a signal level at the output of the coupler approximately agrees with a signal level at the input of the device under test.

19. A measuring device for measuring intermodulation distortions of a device under test comprising:

a first signal generator, which generates a first high-frequency signal, which is supplied indirectly or directly to an input of the device under test:

a signal combiner, of which the first input is indirectly or directly connected to the output of the device under test;

a signal analyzer, which is indirectly or directly connected to the output of the signal combiner; and a second signal generator synchronized with the first signal generator, which generates a second high-frequency signal, which is supplied indirectly or directly to a second input of the signal combiner, wherein the signal analyzer records the signal from the first signal generator arriving at the signal combiner and drives the second signal generator in such a maimer that the second signal generator emits the second high-frequency signal in dependence upon the recorded signal.

20. A measuring device for measuring intermodulation distortions of a device under test comprising:

a first signal generator, which generates a first high-frecquency signal, which is supplied indirectly or directly to an input of the device under test;

a signal combiner, of which the first input is indirectly or directly connected to the output of the device under test;

a signal analyzer, which is indirectly or directly connected to the output of the signal combiner; and a second signal generator synchronized with the first signal generator, which generates a second high-frequency signal, which is supplied indirectly or directly to a second input of the signal combiner, wherein the signal analyzer records the signal from the second signal generator arriving at the signal combiner and drives the first signal generator in such a manner that the first signal generator emits the first high-frequency signal in dependence upon the recorded signal.

* * * * *